US 6,667,910 B2

(12) United States Patent
Abedifard et al.

(10) Patent No.: US 6,667,910 B2
(45) Date of Patent: Dec. 23, 2003

(54) METHOD AND APPARATUS FOR DISCHARGING AN ARRAY WELL IN A FLASH MEMORY DEVICE

(75) Inventors: Ebrahim Abedifard, Sunnyvale, CA (US); Allahyar Vahidimolavi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 10/141,837

(22) Filed: May 10, 2002

(65) Prior Publication Data
US 2003/0210572 A1 Nov. 13, 2003

(51) Int. Cl.[7] ............................................. G11C 16/04
(52) U.S. Cl. ......................... 365/185.29; 365/185.23; 365/185.25; 365/185.31
(58) Field of Search ..................... 365/189.29, 185.18, 365/185.31, 185.25, 185.23

(56) References Cited

U.S. PATENT DOCUMENTS

| | | | | |
|---|---|---|---|---|
| 5,297,104 A | * | 3/1994 | Nakashima | 365/230.06 |
| 5,721,704 A | * | 2/1998 | Morton | 365/185.23 |
| 5,729,493 A | * | 3/1998 | Morton | 365/185.21 |
| 6,031,774 A | * | 2/2000 | Chung | 365/204 |
| 6,072,725 A | * | 6/2000 | Le et al. | 365/185.29 |
| 6,233,177 B1 | * | 5/2001 | Shokouhi et al. | 365/185.23 |
| 6,456,534 B2 | * | 9/2002 | Jinbo | 365/185.25 |

* cited by examiner

Primary Examiner—Richard Elms
Assistant Examiner—Hien Nguyen
(74) Attorney, Agent, or Firm—Dickstein Shapiro Morin & Oshinsky, LLP

(57) ABSTRACT

A flash memory device is disclosed in which an erase voltage is applied to a well containing flash memory transistors during an erase operation. The well is then discharged toward ground, first by one discharge circuit which discharges the well until the voltage on the well is lower than a snap-back characteristic of a transistor employed in another well discharge circuit. After the well voltage is below the snap-back characteristic of the transistor, the well is discharged by the other discharge circuit.

56 Claims, 10 Drawing Sheets

METHOD AND APPARATUS FOR DISCHARGING AN ARRAY WELL IN A FLASH MEMORY DEVICE

FIELD OF THE INVENTION

The present invention relates to discharging of flash memory array wells containing memory transistors after an erase operation.

BACKGROUND OF THE INVENTION

The operation of flash memory transistors is well know in the art. Flash memory transistors are typically arranged in row and column in memory bank arrays in a flash memory device. Each of the memory banks has the associated flash transistors fabricated within a doped conductivity well. For example, N-channel memory transistors are typically fabricated in a p type conductivity well (p well).

FIG. 1 illustrates a conventional N-channel flash memory transistor 25 provided in a p-well 35 of a substrate 11 of a flash memory device. The transistor 25 includes drain 13 and source 15 regions of n+ conductivity provided in the p-well 35. The gate structure of the transistor 25 includes tunnel oxide 17, floating gate 19, a dielectric, e.g., an ONO layer, 21, and a control gate 23. Also shown in FIG. 1 are a bit line 27 which connects to the drain region and a ground line 29 which connects with the source region 15.

During an erase operation for a memory device containing the transistor 25, the array p-well 35, which is typically at ground potential is elevated to an erase voltage of typically eight volts or higher. After the erase voltage is applied, the p-well 35 must be brought back to a ground level as quickly as possible for subsequent memory operations.

However, to pull p-well 35 to ground after a memory operation typically requires an NMOS transistor. Unfortunately, the voltages used for an erase operation typically exceed the snap back voltage of NMOS transistors.

FIG. 4 illustrates the snap-back characteristic of an NMOS transistor where the snap-back effect is observed at a voltage of 5.5 volts. Using such a transistor to discharge a voltage greater than 5.5 volts causes erratic and possibly catastrophic operation of the transistor which makes it difficult to quickly or reliably discharge the erase voltage applied to the p-well 35.

Accordingly, elaborate discharge circuits are required to discharge the p-well well to ground to avoid the snap back problem of NMOS transistors.

It would be desirable to provide a simplified way to discharge the erase voltage quickly and reliably without requiring a complex discharge circuit.

BRIEF SUMMARY OF THE INVENTION

The present invention provides a simple method and apparatus which employ a discharge circuit for discharging the erase voltage applied to an array well of a flash memory device. The discharge circuit includes a main discharge circuit for discharging an array well to ground using an n-channel transistor which may be subject to a snap-back effect due to the applied erase voltage. Accordingly, this transistor is held in an off state until an auxiliary discharge circuit of the discharge circuit first discharges the p-well array voltage to a level below a voltage which will induce the snap-back of the main discharge circuit n-channel transistor. When the erase voltage has been reduced to below the snap back voltage by the auxiliary discharge circuit, the NMOS transistor of the main discharge circuit is turned on to quickly bring the remaining erase voltage on the array well to ground.

In an exemplary embodiment, the main discharge circuit comprises the n-channel transistor which is subject to a snap-back effect at a predetermined voltage level, and the auxiliary discharge circuit comprises a p-channel transistor circuits, or a plurality of p-channel transistor circuits operating in parallel.

The method and apparatus of the invention can be applied to a flash memory device having plural banks of memory arrays, with the transistors of each bank having their own array p-well and with each array p-well having a respective discharge circuit.

These and other objects, advantages and features of the invention will be more clearly understood from the following detailed description of the invention which is provided in connection with the accompanying drawings.

DETAILED DESCRIPTION OF THE INVENTION

Figure 1:
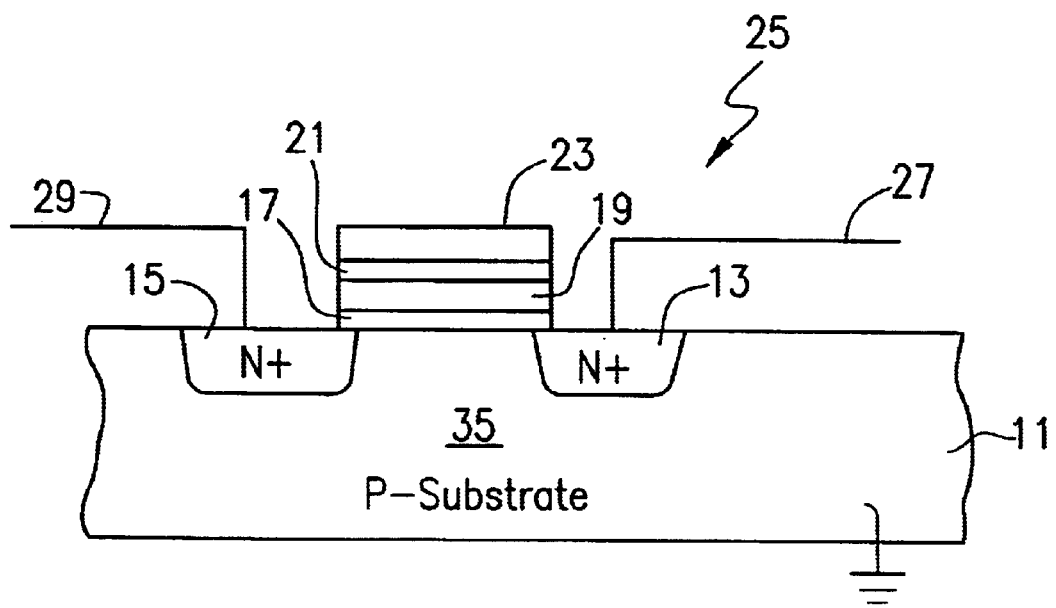
FIG. 1 illustrates a conventional n-channel flash memory transistor.
Figure 2:
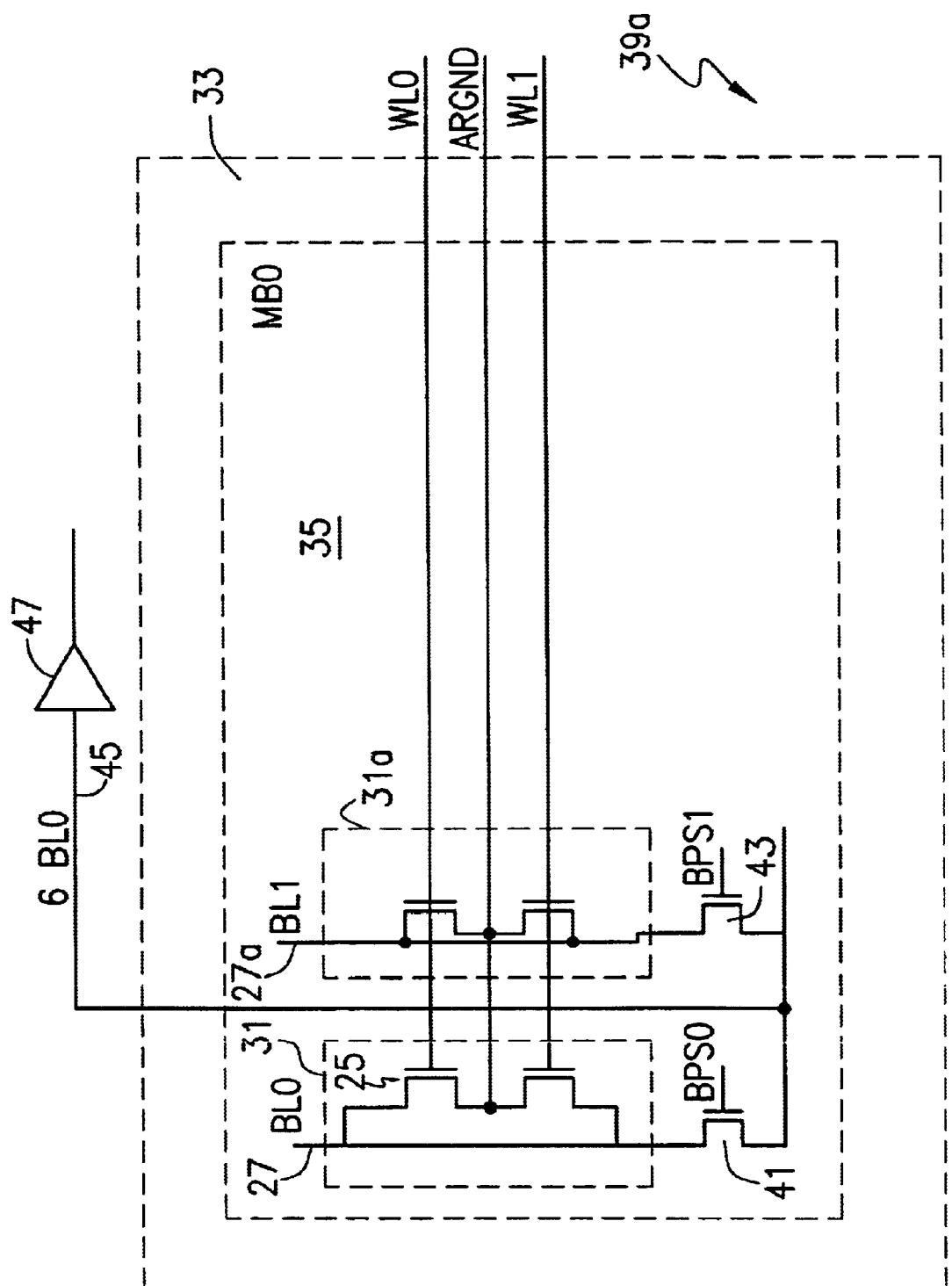
FIG. 2 illustrates an environment in which the invention is used, including a flash memory bank array.

FIG. 2 illustrates an exemplary environment in which the invention may be used. A memory bank 39a, which is one of a plurality of memory banks 39a, 39b, 39c . . . employed in a flash memory device 40 (FIG. 8), is fabricated to include a p-well 35 which is surrounded for isolation purposes by an n-well 33. A cross-section of a portion of the substrate of the array of memory bank 39a is illustrated in greater detail in FIG. 3. The p-well 35 is surrounded by the n-well 33. A deep implant 37, formed as a buried n-channel region, is also provided beneath the p-well 35. It should be noted that although the invention is described with reference to use of a p-well 35 and associated n-channel memory transistors as part of the memory array, the invention can be fabricated with complementary technology as well.

Fabricated within the p-well 35 is a flash memory array which includes a plurality of flash memory transistors 25 arranged in rows and columns. A portion of the transistor array is shown in FIG. 2. A pair of flash memory transistors 25 have their drains 13 coupled to a bit line 27 and their sources coupled together to a ground line ARGND. Each of the transistors 25 which form a paired set of transistors 31 have respective word lines WL0, WL1 connected to their gates. Bit line 27 is in turn connect to a bit line access transistor BPS0 41 which couples the bit line 27 to a global bit line 45 and from there to a sense amplifier 47. Likewise, bit line access transistor BPS1 43 couples bit line 27a from an adjacent pair 31a of memory transistors, to global bit line 45 and from there to the sense amplifier 47.

During an erase operation a voltage of approximately 9 volts is applied to p-well 35 which must be quickly discharged to complete the erase operation.

Figure 5:
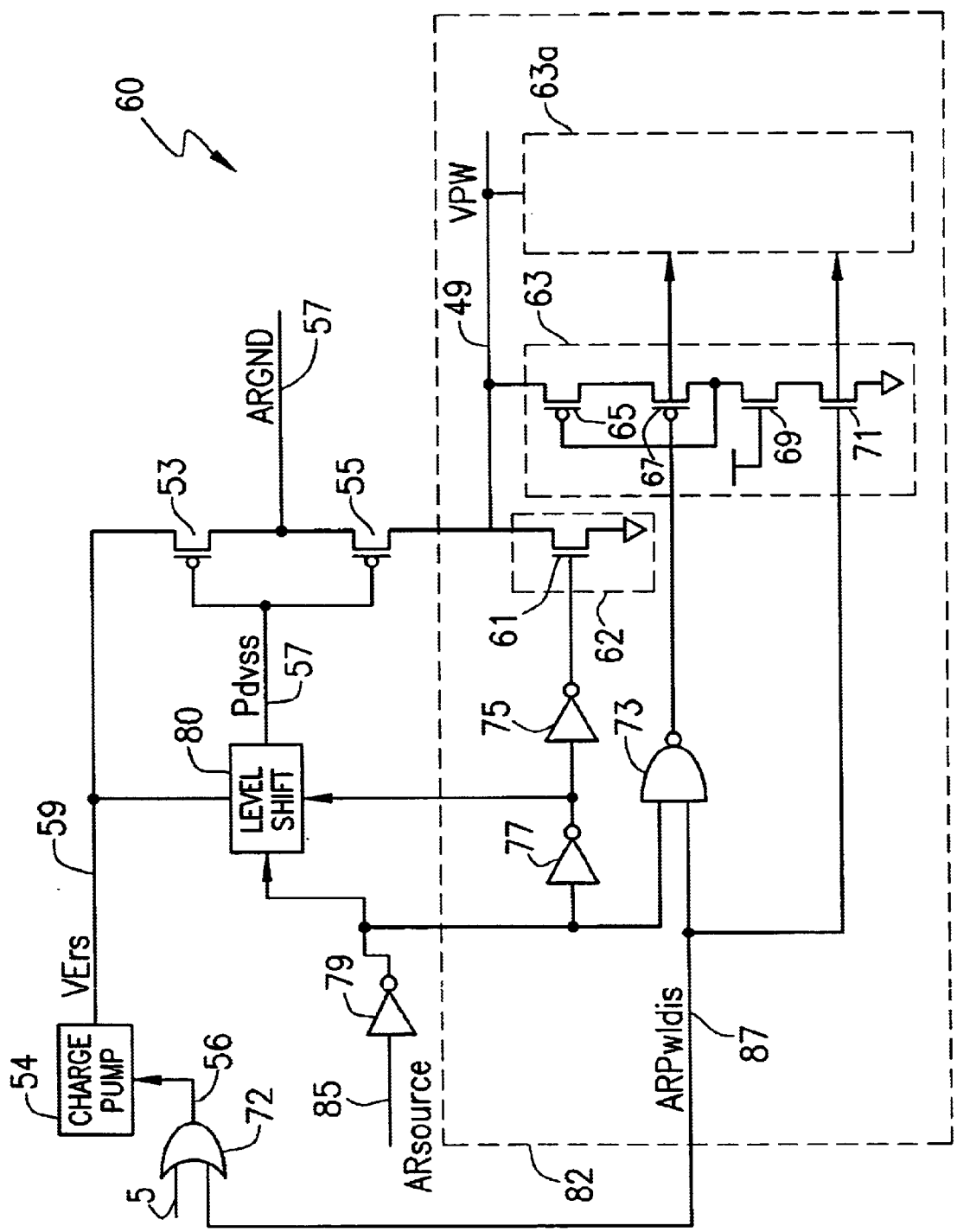
FIG. 5 illustrates a circuit in accordance with an embodiment of the invention.

FIG. 5 illustrates a charging/discharging circuit 60 for applying an erase voltage VErs to the p-well 35 and then discharging the p-well 35 to ground. The erase voltage VErs is applied on line 59 from a charge pump 54 activated by a control signal on line 56. The erase voltage is applied through a pair of serially connected p-channel transistors 53 and 55 which when gated on apply the erase voltage to p-well 35 via signal line 49 as a p-well voltage VPW. A signal AR Source, which goes high during the time pump 54 is on, is applied on line 85 to a logic circuit acting as an inverter 79 which causes a voltage level shifting circuit 80 to provide a control signal Pdvss on line 57 to the gates of the p-channel transistors 53 and 55, turning them on. The level shifting circuit 80 applies an appropriate higher voltage signal to the gates of transistors 53, 55 from a TTL logic level signal input to the level shifting circuit 80. The level shifting circuit 80 requires complementary input signals so the output of inverter 79 passes directly to one input of level shifting circuit 80 and through inverter 77 to another input of level shifting circuit 80. When the output of level shifting circuit 80 turns on transistors 53, 55 the erase voltage VErs on line 59 is applied to the conductor 49 which connects to the p-well 35.

After the erase voltage VErs is applied to conductor 49, it must be removed from p-well 35. To this end, a p-well discharge circuit 82 is used which contains a main discharge circuit 62 formed as an n-channel transistor 61 for quickly discharging the voltage on conductor 49 to ground. However, transistor 61 is subject to a snap-back characteristic at the erase voltage VErs employed which, as noted, is typically 9 volts. Accordingly, before transistor 61 is turned on to discharge the erase voltage on line 49 to ground, an auxiliary discharge circuit 63, which includes PMOS transistor 65 and 67, is first activated to begin the discharge cycle. The auxiliary discharge circuit 63 is formed by the series interconnection of the two p-channel transistors 65 and 67, and two n-channel transistors 69 and 71.

Figure 6:
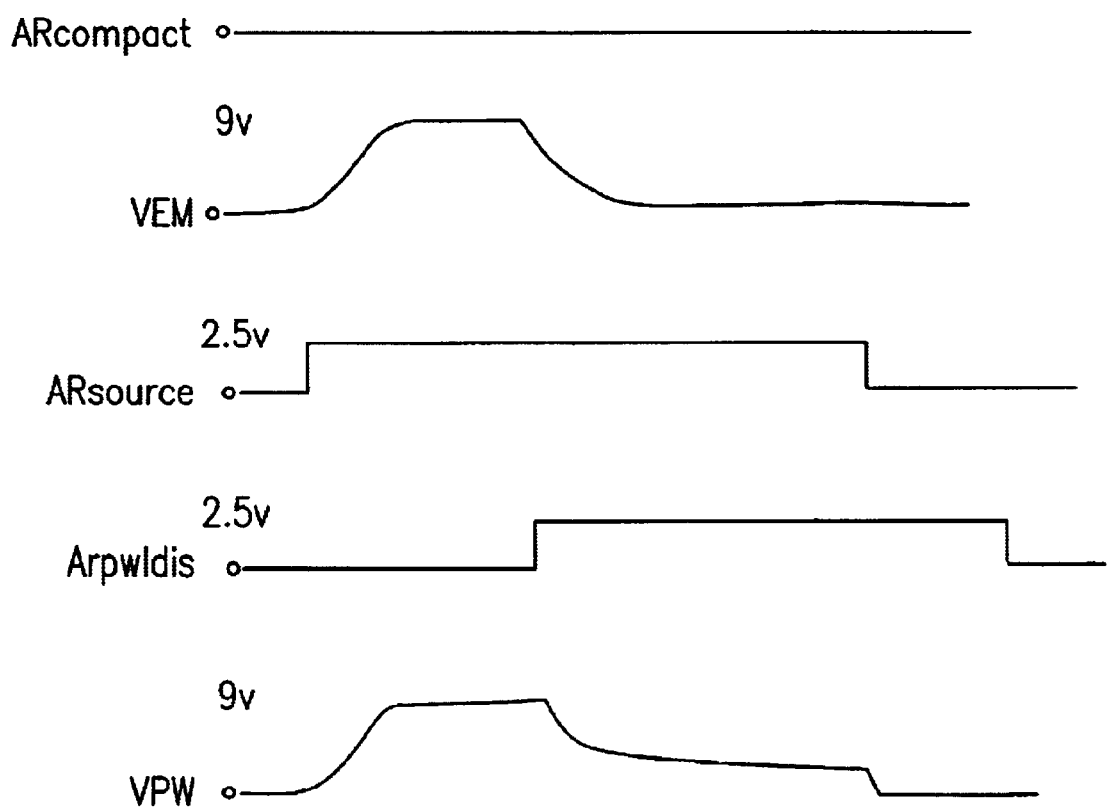
FIG. 6 illustrates signal diagrams useful in explaining operation of the invention.

The p-well 35 discharge is initiated by a control signal ARPwldis on line 87 which goes high. The ARPwldis signal is input to a NAND gate 73. ARPwldis is also applied to the gate of an n-channel transistor 71 in the auxiliary discharge circuit 63 and to one input of an OR gate 72. An output of OR gate 72 is connected to the control line 56 that carries the signal controlling charge pump 54. When the ARPwldis signal goes high, it turns on n-channel transistor 71. As the ARPwldis signal goes high, it also turns off the charge pump 54 through OR gate 72 and, through NAND gate 73, it turns on p-channel transistor 67. When transistor 71 is on a voltage near ground is applied to the gate of p-channel transistor 65 also turning it on. It is noted that n-channel transistor 69 is connected to Vcc, and thus it too is on. Accordingly, and as shown in FIG. 6, when ARPwldis goes high to initiate p-well 35 discharge by discharge circuit 82, the p-well 35 erase voltage VErs0 which is at 9 volts begins to discharge pulling conductor 49 (VPW) towards ground potential. At the same time, node Vers 59 is discharged through PMOS transistor 53 and PMOS transistor 55 to ground while the ARSource line 85 goes high.

The auxiliary discharge circuit 63 discharges the erase voltage at a regulated and slower rate than the main discharge circuit formed by n-channel transistor 61. P-channel transistor 65 regulates the discharge rate. Accordingly, after the discharging erase voltage reaches a voltage level at which transistor 61 is no longer susceptible to snap back, transistor 61 is turned by the signal ARsource going low to quickly complete discharge of VPW from the erase voltage VErs to ground.

The operation of the auxiliary 63 and main 61 discharge circuits is illustrated by the signal diagrams in FIG. 6. A shown, the erase voltage VErs is applied to p-well 35 from pump 54 when pump 54 is on and the signal ARsource goes high. Following this when the ARPwldis signal goes high, it turns on the auxiliary discharge circuit 63. The erase voltage at conductor 49 then begins to decrease. After the p-well 35 voltage has decreased below a voltage which would cause snap back of transistor 61 the ARsource signal goes low. When the ARsource signal goes low, the low signal is applied through inverter 79 and inverters 77, 75 as a high signal which turns on transistor 61 to immediately begin a quick discharge of the remaining voltage on p-well 35 to ground via conductor 49. ARsource signal on line 85 is also coupled by way of inverter 79 to NAND gate 73 to turn off the p-channel transistor 67 so that the auxiliary discharge circuit 63 stops discharging the voltage on line 49, when the main discharge circuit 62 formed of n-channel transistor 61 begins to operate.

FIG. 5 also shows an additional auxiliary discharge circuit 63a which may be provided in parallel with auxiliary discharge circuit 63 and which operates the same way as described and illustrated above with respect to auxiliary circuit 63 to assist in discharging the erase voltage on conductor 49 to a voltage below the snap-back voltage characteristic of transistor 61.

Figure 7:
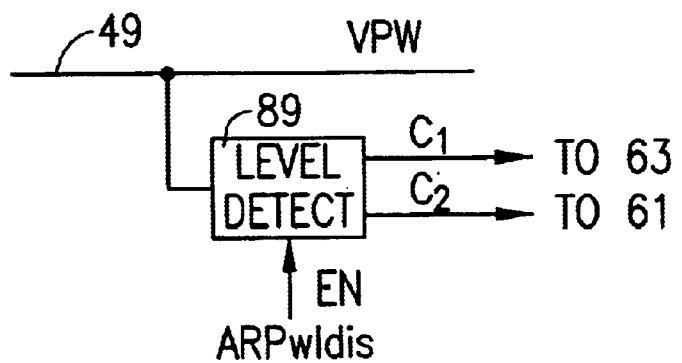
FIG. 7 illustrates an alternative embodiment of the invention.

The FIG. 5 embodiment is operated in accordance with the timing characteristics of applied control signals ARsource and ARPwldis so that transistor 61 is turned on at a time after which the voltage on conductor 49 is lowered by auxiliary discharge circuit 63 to a value at or below the snap-back characteristic of transistor 61. In addition, and as shown in FIG. 7, in an alternative embodiment, a voltage level detection circuit can be used in lieu of the signal timing of the FIG. 5 embodiment to control the auxiliary discharge circuit 63 and main discharge circuit including transistor 61.

Figure 10:
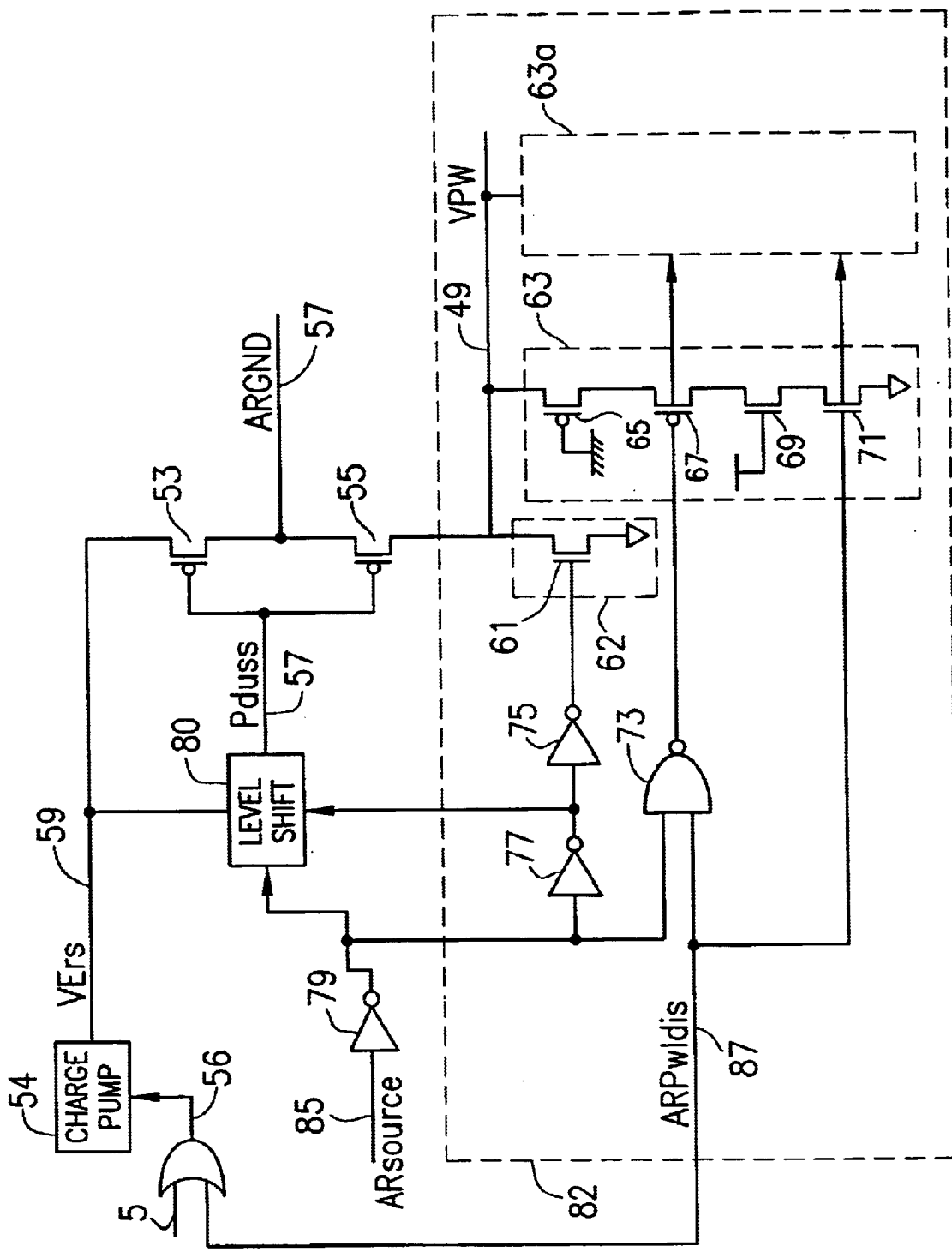
FIG. 10 illustrates an alternative embodiment of the invention of Figure including a PMOS device with a gate connection to ground.

In the FIG. 10 embodiment the gate of PMOS transistor 65 is permanently coupled to ground. Accordingly, transistor 65 becomes conductive as soon as the voltage on node VPW 49 exceeds one PMOS threshold voltage above ground potential.

In the FIG. 7 embodiment, the voltage level detector 89 supplies two control signals C1 and C2 depending on whether the voltage on the conductor 49 is above or at or below the snap-back characteristic voltage of transistor 61. Thus, when the level detect is enabled by the ARPwldis signal on line 87 going high the signal C1 is supplied to the auxiliary discharge circuit 63 to begin discharge of the voltage on conductor 49. When level detector 89 senses that the voltage on conductor 49 has fallen to or below the snap back voltage of transistor 61, control signal C1 is terminated and a control signal C2 is issued instead to transistor 61 causing it to turn on and continue the discharge of the voltage on line 49 to ground. Thus, in the FIG. 7 embodiment actual detection of the voltage on line 49 is used in lieu of the timed signal operation illustrated in the FIG. 5 embodiment to switch from the auxiliary discharge circuit 62 to the main discharge circuit 62.

Figure 5A:
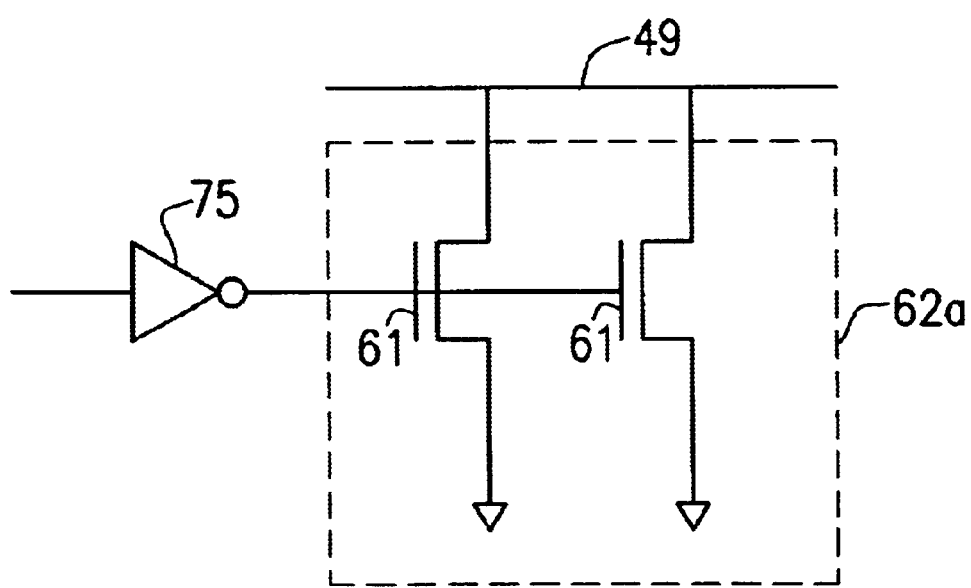
FIG. 5a illustrates a modification of the FIG. 5 embodiment; the invention.

The embodiments of the invention described above turn off the auxiliary discharge circuit 63 when the main discharge circuit 62 is turned on. Both embodiments may also be configured to keep the auxiliary discharge circuit 63 on for at least a beginning portion of the operation of the main discharge circuit 62. Also, although the main discharge circuit 62 is shown as including one NMOS transistor 61, it is also possible for the main discharge circuit 62 to use a plurality of NMOS transistors 61 in parallel to discharge p-well 35, as shown by main discharge circuit 62a in FIG. 5a. Other main discharge circuit 62 configurations which have one or more N-MOS transistors which are subject to snap back may also be used.

Figure 3:
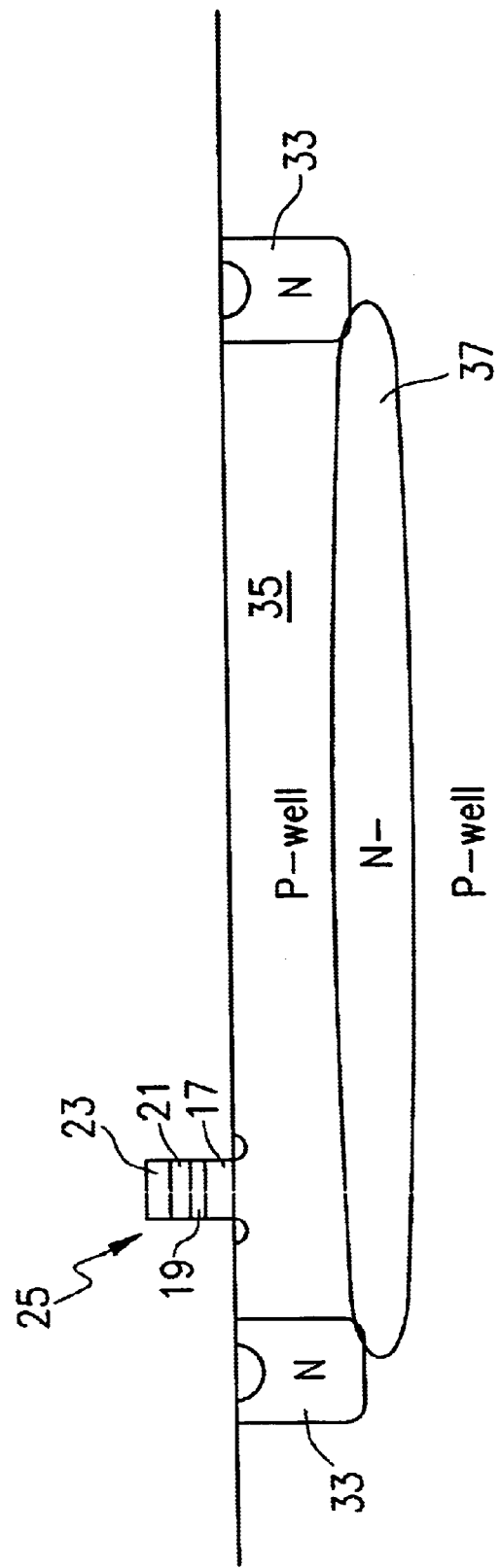
FIG. 3 illustrates a cross-sectional view of the memory bank array of FIG. 2.
Figure 4:
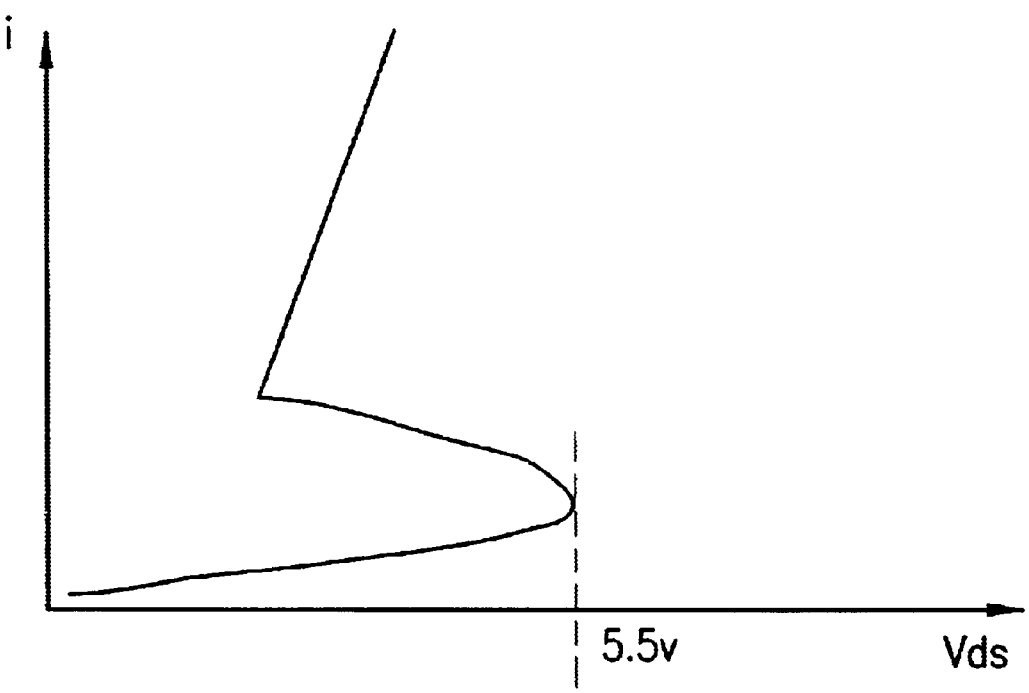
FIG. 4 illustrates the snap-back characteristic of an n-channel transistor.
Figure 8:
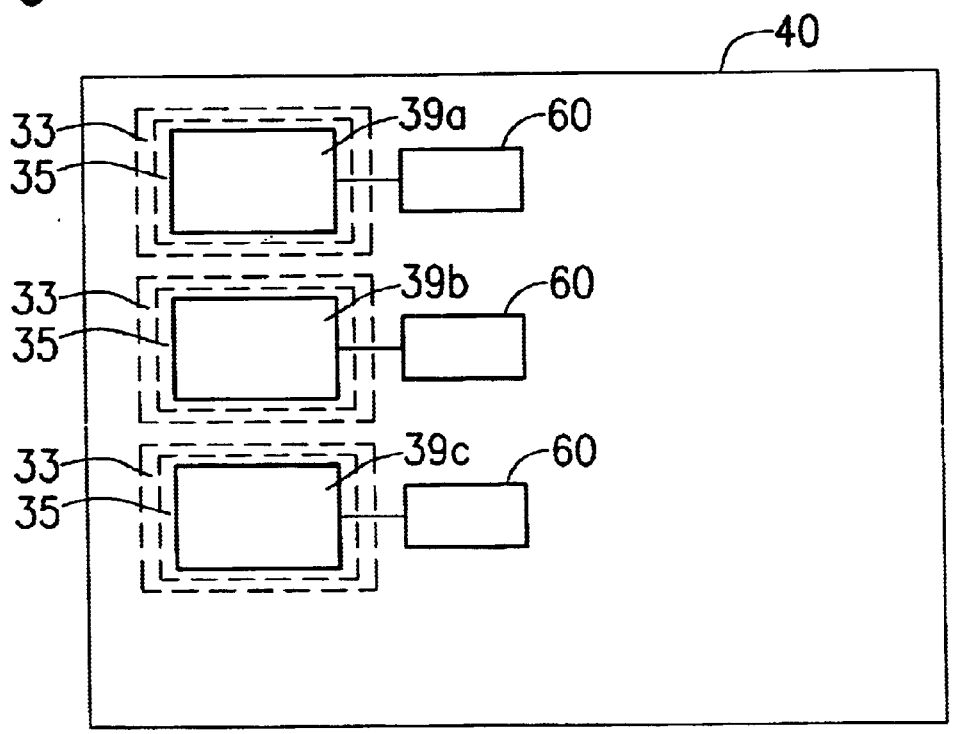
FIG. 8 illustrates a flash memory device having a plurality of memory banks which may employ the invention.

FIG. 8 illustrates the flash memory device 40 as containing a plurality of memory banks 39a, 39b, 39c . . . , each of which is fabricated in a respective p-well 35 having a surrounding n-well 33, as illustrated in FIGS. 2 and 3. Each of the p-wells 35 shown in FIG. 8 has its own respective charge and discharge circuit 60.

Figure 9:
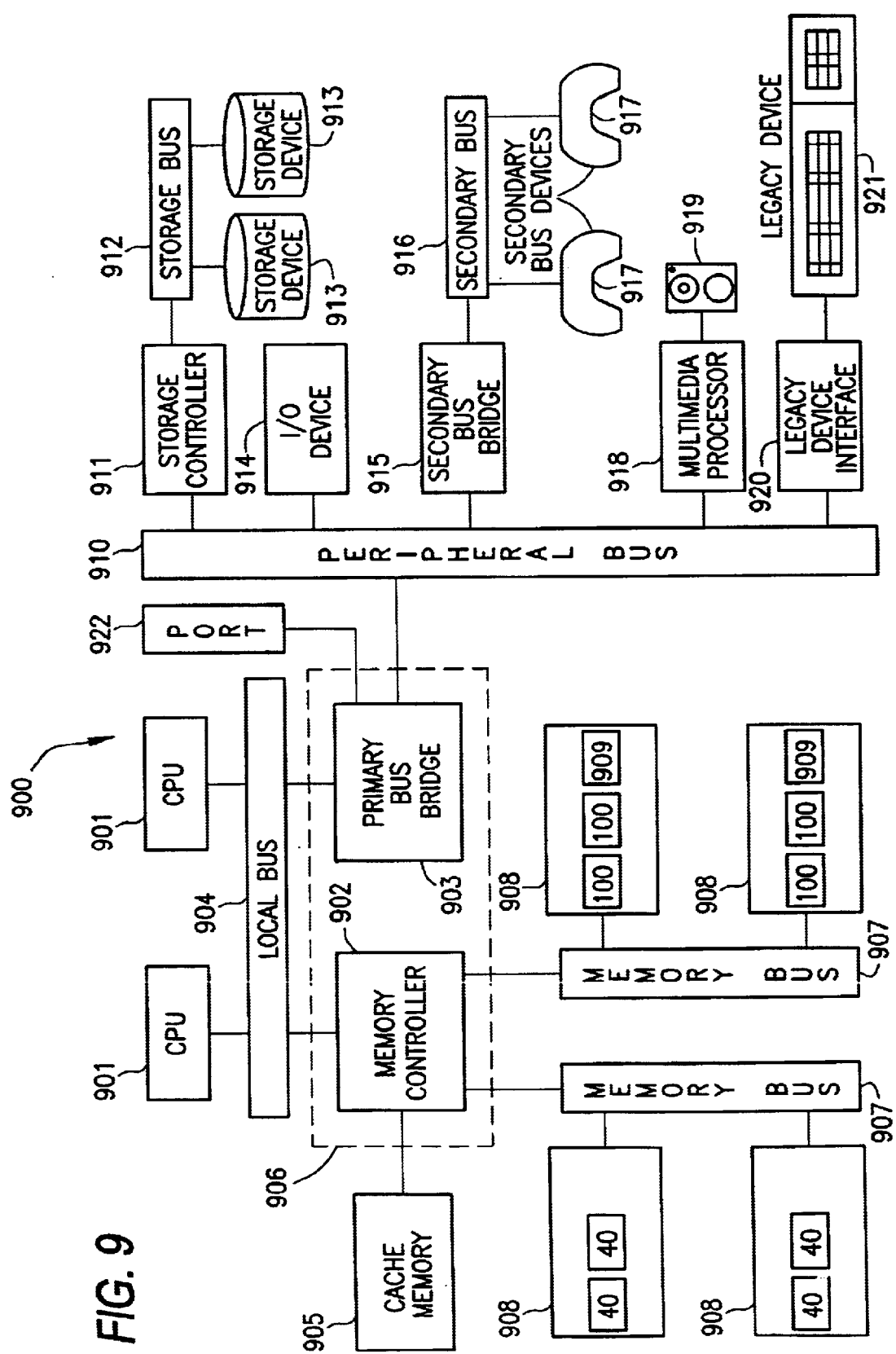
FIG. 9 illustrates the invention employed in a flash memory device which is part of a processor system.

FIG. 9 illustrates the processor system 900 incorporating a flash memory device 40 containing the invention illustrated in the embodiments of FIGS. 5 and 7. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one flash memory device 40 constructed to include a p-well discharge circuit of the present invention. The memory components 908 may be a memory card or a memory module. The memory controller 902 may also be coupled other memory components such as DRAM memory devices 100 and to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 9 is only one exemplary processing system with which the invention may be used. While FIG. 9 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 40 and/or 100. These electronic devices may include, but are not limited to audio/video processors and recorders, gaming consoles, digital television sets, wired or wireless telephones, navigation devices (including system based on the global positioning system (GPS) and/or inertial navigation), digital cameras and/or recorders, and other digital devices. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A discharge circuit for a semiconductor well, said discharge circuit comprising:

a first discharge circuit for discharging said well towards a first voltage value, said first discharge circuit operative when the voltage on said well is below a first voltage level; and at least one second discharge circuit for discharging said well towards said first voltage value, said second discharge circuit operative at least when the voltage on said well is above said first voltage level.

2. The discharge circuit of claim 1 wherein said first voltage is ground voltage.

3. The discharge circuit of claim 1 wherein said semiconductor well is provided in a flash memory device and said well is biased to a voltage greater than said first voltage level during an erase operation, said first and second discharge circuit cooperating to discharge said well from said voltage greater than said first voltage level after an erase operation to reduce the voltage applied to said well to a ground voltage value.

4. The discharge circuit of claim 3 wherein said well is a p-well and first discharge circuit comprises at least one NMOS transistor and said second discharge circuit comprises at least one PMOS transistor.

5. The discharge circuit of claim 4 wherein said at least one NMOS transistor has a snap-back characteristic which occurs at a voltage level higher than said first voltage level.

6. The discharge circuit of claim 4 wherein said second discharge circuit is first operative and discharges said p-well more slowly than said first discharge circuit and said first discharge circuit is subsequently operative when said p-well voltage fails below said first voltage level to discharge said p-well more rapidly than said second discharge circuit.

7. The discharge circuit of claim 5 wherein said first discharge circuit comprises a gating circuit for gating on first discharge circuit after said p-well voltage falls below said first level.

8. The discharge circuit of claim 7 wherein said gating circuit is responsive to a control signal which changes state at a time after said p-well voltage falls below said first level.

9. The discharge circuit of claim 5 further comprising a voltage level detecting circuit for turning on said first discharge circuit when said p-well voltage falls below a level where said at least one NMOS transistor exhibits a snap-back characteristic.

10. The discharge circuit of claim 9 wherein said voltage level detecting circuit turns off said second discharge circuit when said p-well bias voltage falls below said level where said at least one NMOS transistor exhibits a snap-back characteristic.

11. The discharge circuit of claim 1 further comprising a plurality of second discharge circuits operating in parallel to discharge said well towards said first voltage value at least when the voltage on said well is above said first voltage level.

12. The discharge circuit of claim 4 wherein said finish discharge circuit comprises a plurality of NMOS transistors.

13. The discharge circuit of claim 12 wherein said plurality of NMOS transistors are arranged in parallel.

14. A flash memory device, comprising:
an array well containing a plurality of flash memory transistors;
a circuit for applying an erase voltage to said array well during a memory erase operation;
a first discharge circuit for discharging the erase voltage applied to said well towards a ground potential, said first circuit being operative when the voltage on said well is below a first voltage level; and
at least one second discharge circuit for discharging said well towards said first voltage value, said second discharge circuit operative at least when the voltage on said well is above said first voltage level.

15. The flash memory device of claim 1 wherein said well is a p-well and said first discharge circuit comprises at least one NMOS transistor and said second discharge circuit comprises at least one PMOS transistor.

16. The flash memory device of claim 15 wherein said at least one NMOS transistor has a snap-back characteristic which occurs at a voltage level higher than said first voltage level.

17. The flash memory device of claim 15 wherein said second discharge circuit is first operative and discharges said p-well more slowly than said first discharge circuit and said first discharge circuit is subsequently operative when said p-well voltage falls below said first voltage level to discharge said p-well more rapidly than said second discharge circuit.

18. The flash memory device of claim 16 wherein said first discharge circuit comprises a gating circuit for gating on first discharge circuit after said p-well voltage falls below said first level.

19. The flash memory device of claim 18 wherein said gating circuit is responsive to a control signal which changes state at a time after said p-well voltage falls below said first level.

20. The flash memory device of claim 16 further comprising a voltage level detecting circuit for turning on said first discharge circuit when said p-well voltage falls below a level where said at least one NMOS transistor exhibits a snap-back characteristic.

21. The flash memory device of claim 20 wherein said voltage level detecting circuit turns off said second discharge circuit when said p-well voltage falls below said level where said at least one NMOS transistor exhibits a snap-back characteristic.

22. The flash memory device of claim 14 further comprising a plurality of second discharge circuits operating in parallel to discharge said well towards said first voltage value at least when the voltage on said well is above said first voltage level.

23. The flash memory device of claim 15 wherein said finish discharge circuit comprises a plurality of NMOS transistors.

24. The flash memory device of claim 23 wherein said plurality of NMOS transistors are arranged in parallel.

25. A processor system comprising:
at least one processor;
at least one flash memory device coupled to exchange data with said processor, said flash memory device comprising:
an array well containing a plurality of flash transistors;
a circuit for applying an erase voltage to said array well during a memory erase operation;
a first discharge circuit for discharging the erase voltage applied to said well towards a ground potential, said first circuit being operative when the voltage on said well is below a first voltage level; and
at least one second discharge circuit for discharging said well towards said first voltage value, said second discharge circuit operative at least when the voltage on said well is above said first voltage level.

26. The processor system of claim 25 wherein said well is a p-well and said first discharge circuit comprises at least one NMOS transistor and said second discharge circuit comprises at least one PMOS transistor.

27. The processor system of claim 26 wherein said at least one NMOS transistor has a snap-back characteristic which occurs at a voltage level higher than said first voltage level.

28. The processor system of claim 26 wherein said second discharge circuit is first operative and discharges said p-well more slowly than said first discharge circuit and said first discharge circuit is subsequently operative when said p-well voltage falls below said first voltage level to discharge said p-well more rapidly than said second discharge circuit.

29. The processor system of claim 27 wherein said first discharge circuit comprises a gating circuit for gating on first discharge circuit after said p-well voltage falls below said first level.

30. The processor system of claim 29 wherein said gating circuit is responsive to a control signal which changes state at a time after said p-well voltage falls below said first level.

31. The processor system of claim 27 further comprising a voltage level detecting circuit for turning on said first discharge circuit when said p-well voltage falls below a level where said at least one NMOS transistor exhibits a snap-back characteristic.

32. The processor system of claim 31 wherein said voltage level detecting circuit turns off said second discharge circuit when said p-well voltage falls below said level where said at least one NMOS transistor exhibits a snap-back characteristic.

33. The processor system of claim 25 further comprising a plurality of second discharge circuits operating in parallel to discharge said well towards said first voltage value at least when the voltage on said well is above said first voltage level.

34. The processor system of claim 26 wherein said finish discharge circuit comprises a plurality of NMOS transistors.

35. The processor system of claim 34 wherein said plurality of NMOS transistors are arranged in parallel.

36. A method of operating a flash memory device, said method comprising:
   charging a well containing a plurality of flash transistors to a first voltage level;
   discharging said well from said first voltage level to a second voltage level using one discharge circuit; and
   discharging said well from said second voltage level to a third voltage level using another discharge circuit.

37. The method of claim 36 wherein said act of charging comprises charging said well to an erase voltage at said first voltage level.

38. The method of claim 36 wherein said another discharge circuit discharges said well with a transistor having a snap-back voltage characteristic which occurs at a voltage higher than said second voltage level.

39. The method of claim 36 further comprising generating a control signal which causes said another discharge circuit to operate, said control signal being generated after said one discharge circuit discharges said well to said second voltage level.

40. The method of claim 36 wherein said well is a p-well.

41. The method of claim 40 wherein said transistor is an NMOS transistor.

42. The method of claim 36 wherein said third voltage is ground potential.

43. The method of claim 36 wherein said one discharge circuit continues to discharge said well after said another discharge circuit begins discharging said well from said second to said third voltage.

44. The method of claim 36 wherein said one discharge circuit stops discharging said well after said another discharge circuit begins discharging said well from said second to said third voltage.

45. The method of claim 36 further comprising discharging said well using said one discharge circuit at a slower rate than the rate of discharging said well using said another discharge circuit.

46. A flash memory device comprising:
   a plurality of array wells, each containing a plurality of flash memory transistors;
   a plurality of charge and discharge circuits as respectively associated with said plurality of array wells, each for charging and discharging a respective array well during a memory erase operation, each of said charge and discharge circuits comprising:
      a circuit for applying an erase voltage to a respective array well during a memory erase operation;
      a first discharge circuit for discharging the erase voltage applied to said respective well towards a ground potential, said first circuit being operative when the voltage on said respective well is below a first voltage level; and
      at least one second discharge circuit for discharging said respective well towards said first voltage value, said second discharge circuit operative at least when the voltage on said respective well is above said first voltage level.

47. The flash memory device of claim 46 wherein said respective well is a p-well and said first discharge circuit comprises at least one NMOS transistor and said second discharge circuit comprises at least one PMOS transistor.

48. The flash memory device of claim 47 wherein said at least one NMOS transistor has a snap-back characteristic which occurs at a voltage level higher than said first voltage level.

49. The flash memory device of claim 47 wherein said second discharge circuit is first operative and discharges said respective p-well more slowly than said first discharge circuit and said first discharge circuit is subsequently operative after said respective p-well voltage falls below said first voltage level to discharge said respective p-well more rapidly than said second discharge circuit.

50. The flash memory device of claim 48 wherein said first discharge circuit comprises a gating circuit for gating on first discharge circuit after said respective p-well voltage falls below said first level.

51. The flash memory device of claim 50 wherein said gating circuit is responsive to a control signal which changes state at a time after said respective p-well voltage falls below said first level.

52. The flash memory device of claim 47 further comprising a voltage level detecting circuit for turning on said first discharge circuit after said respective p-well voltage falls below a level where said at least one NMOS transistor exhibits a snap-back characteristic.

53. The flash memory device of claim 52 wherein said voltage level detecting circuit turns off said second discharge circuit when said respective p-well voltage falls below said level where said at least one NMOS transistor exhibits a snap-back characteristic.

54. The flash memory device of claim 46 further comprising a plurality of second discharge circuits operating in parallel to discharge said respective well towards said first voltage value at least when the voltage on said well is above said first voltage level.

55. The flash memory device of claim 47 wherein said finish discharge circuit comprises a plurality of NMOS transistors.

56. The flash memory device of claim 55 wherein said plurality of NMOS transistors are arranged in parallel.

* * * * *